US012707614B2

(12) United States Patent
Mann et al.

(10) Patent No.: US 12,707,614 B2
(45) Date of Patent: Aug. 11, 2026

(54) SYSTEMS AND METHODS FOR EMI SHIELDING

(71) Applicant: GM Cruise Holdings LLC, San Francisco, CA (US)

(72) Inventors: Sebastian Mann, Munich (DE); Mathias Sattler, Starnberg (DE); Kilian Stach, Munich (DE); Bruno Alexander Graf, Munich (DE); Javier Abraham Marto Saavedra, Munich (DE); Benedikt Sanftl, Riedering (DE)

(73) Assignee: GM CRUISE HOLDINGS LLC, San Francisco, CA (US)

( * ) Notice: Subject to any disclaimer, the term of this patent is extended or adjusted under 35 U.S.C. 154(b) by 512 days.

(21) Appl. No.: 18/308,654

(22) Filed: Apr. 27, 2023

(65) Prior Publication Data

US 2024/0357782 A1 Oct. 24, 2024

(30) Foreign Application Priority Data

Apr. 18, 2023 (EP) .................................... 23168584

(51) Int. Cl.
*H05K 9/00* (2006.01)

(52) U.S. Cl.
CPC ......... *H05K 9/0088* (2013.01); *H05K 9/0024* (2013.01); *H05K 9/0084* (2013.01)

(58) Field of Classification Search
CPC .. H05K 9/0088; H05K 9/0024; H05K 9/0084; H05K 9/0016
See application file for complete search history.

(56) References Cited

U.S. PATENT DOCUMENTS

| | | | | |
|---|---|---|---|---|
| 6,985,366 | B2 * | 1/2006 | Albayrak | H05K 9/0026 361/818 |
| 7,463,496 | B2 * | 12/2008 | Robinson | H05K 9/0032 361/818 |
| 2007/0011693 | A1 * | 1/2007 | Creasy | C08K 5/49 428/317.1 |
| 2010/0089619 | A1 | 4/2010 | Chen et al. | |
| 2011/0188226 | A1 * | 8/2011 | Kim | H05K 9/0035 361/818 |
| 2017/0052575 | A1 * | 2/2017 | Stellman | G06F 1/203 |
| 2019/0004571 | A1 * | 1/2019 | Sahu | G06F 1/182 |
| 2022/0132711 | A1 * | 4/2022 | Tainaka | H01P 1/30 |
| 2023/0059342 | A1 * | 2/2023 | Mann | H01P 1/207 |

OTHER PUBLICATIONS

"Extended European Search Report for European Patent Application No. 23168584.3", Mailed Date: Oct. 11, 2023, 8 pages.

* cited by examiner

*Primary Examiner* — Crystal L Hammond
*Assistant Examiner* — Samantha L Faubert
(74) *Attorney, Agent, or Firm* — CANTOR COLBURN LLP

(57) ABSTRACT

Various technologies described herein pertain to systems and methods for shielding electric circuits from electromagnetic radiation or radio waves. The systems and methods include, for example, a shield having a body with a top portion and a plurality of side portions extending therefrom. The side portions include one or more extensions acting as spring contacts or spring elements and one or more gaps therebetween. The extensions are, for example, either individually or as a group flexible in that they can compress, bend, or otherwise deform under force thus having a spring characteristic that compensates for PCB irregularities (e.g., warping, bending, etc.).

18 Claims, 9 Drawing Sheets

108
204
214
206
200
302
202
212
210
208
300

108
204
214
206
200
400
402
202
210
212
208

108
200
500
210
A1
504
502
506
102

F1
108
200
210
502
A2
504
506
102
F2

SYSTEMS AND METHODS FOR EMI SHIELDING

RELATED APPLICATION

This application claims priority to European Patent Application No. 23168584.3, filed on Apr. 18, 2023, and entitled "SYSTEMS AND METHODS FOR EMI SHIELDING". The entirety of this application is incorporated herein by reference.

BACKGROUND

Radar has been used to assist various vehicle functions such as, for example, collision avoidance, cruise or flight control, and the positioning and movement of objects. Radar works by emitting high-frequency radio waves and measuring the reflection, or echo, of the waves from illuminated objects. The time delay between the transmission and reception of the waves is used to determine the distance, speed, and direction of the object. This information is processed by the vehicle's onboard computer to provide real-time information to enhance vehicle navigation and safety.

Radar systems typically include circuits for amplifying and/or converting radar signals for transmission and/or for reception. These circuits include, for example, MMICs (monolithic microwave integrated circuits). MMICs are a type of integrated circuit operating at microwave frequencies, typically between 1 GHz and 100 GHz, and are designed to perform a variety of functions such as amplification, mixing, filtering, and signal generation.

When MMICs operate at microwave frequencies, they can generate high frequency electromagnetic fields that can interfere (EMI) with other electronic devices and systems. If not properly managed, EMI can lead to performance degradation, communication errors, and even system failure. What is desired are systems and methods that address these and other issues related to EMI.

SUMMARY

This summary presents a simplified overview to provide a basic understanding of some aspects of the systems and/or methods discussed herein. This summary is not an extensive overview of the systems and/or methods discussed herein. It is not intended to identify key/critical elements or to delineate the scope of such systems and/or methods. Its sole purpose is to present some concepts in a simplified form as a prelude to the more detailed description that is presented later.

Various technologies described herein pertain to systems and methods for shielding electric circuits from electromagnetic radiation or radio waves. The systems and methods include, for example, a shield having a body with a top portion and a plurality of side portions extending therefrom. The side portions include one or more extensions acting as spring contacts or spring elements and one or more gaps therebetween. The extensions are, for example, either individually or as a group flexible in that they can compress, bend, or otherwise deform under force thus having a spring characteristic. The extensions can have a variety of shapes/arrangements that allow them to flex and/or bend to make contact with various portions of a printed circuit board such as, for example, a reference circuit or reference contact on the printed circuit board. By having such a spring characteristic, the extensions can flex and/or compress to maintain contact with the circuit board reference circuit even though the circuit board may exhibit irregularities. These irregularities can include, for example, bending or warping of the circuit board due to, for instance, the circuit board being large in size. The widths of the gaps and the distance between the extensions can be tailored to the frequency of electromagnetic radiation intended to be shielded. The shielding is provided by the shield being made of or having a conductive material (e.g., metal) and its one or more extensions contacting the reference voltage of the emitting circuits.

In other embodiments, a mask is provided wherein the shield and electrical circuit reside within a cavity of the mask. The mask can be made of metal material or a material having metal (e.g., therein and/or a coating and/or layer) and can be in electrical communication with the shield (e.g., via direct or indirect contact with one or more portions of the shield). In yet other embodiments, a thermal interface material (TIM) may be provided to transfer heat away from the electric circuit. The TIM can be placed between the electric circuits packages and the mask, in which case the shield includes an opening or aperture through which the TIM material or layer extends to contact the mask on one side and the electric circuits packages on the other. In other embodiments, the TIM material or layer can be in direct contact by having a top portion of the shield positioned between the TIM material or layer and the electric circuit.

In yet another embodiment, an electrical system is provided having a printed circuit board and a shield. The printed circuit board includes an electric circuit that emits electromagnetic radio frequency emissions. The shield has, for example, a top portion and a plurality of side portions connected to the top portion and surrounding the electric circuit, this shield in addition to the printed circuit board copper creates a substantially three hundred and sixty degrees confinement zone for the electromagnetic energy. The plurality of side portions include, for example, one or more spring contacts and one or more gaps, wherein the gaps are disposed between the spring contacts. And, the one or more spring contacts have, for example, a compressed state when contacting a reference circuit of the printed circuit board.

In a further embodiment, a radar system having a printed circuit board and a metal shield is provided. The printed circuit board includes a microwave radar circuit having electro-magnetic radio frequency emissions. The metal shield has, for example, a top portion and a perimeter connected to the top portion and at least partially surrounding the circuit. The perimeter includes, for example, one or more spring elements and one or more gaps, wherein the gaps are disposed between the spring elements. The one or more spring elements having, for example, a bent position when contacting a reference circuit of the printed circuit board.

In yet a further embodiment, a method of forming a shielded electrical circuit is provided. The method includes, for example, providing a printed circuit board having a circuit that generates electro-magnetic radio frequency emissions, and placing a metal shield on the circuit board. The step of placing a metal shield on the circuit board includes, for example, compressing one or more spring elements of the metal shield thereby placing the one or more spring elements in contact with the reference voltage of the circuits. The step of compressing one or more spring elements can include, for example, bending the one or more spring elements. The method can further include, for example, securing the metal shield on the circuit board by placing the metal shield within a cavity of a conductive mask layer of the printed circuit board.

BRIEF DESCRIPTION OF THE DRAWINGS

In the accompanying drawings which are incorporated in and constitute a part of the specification, disclosures and embodiments of the invention(s) are illustrated, which, together with a general description given above, and the detailed description given below, serve to disclose and exemplify principles of the invention(s).

DETAILED DESCRIPTION

Figure 1:
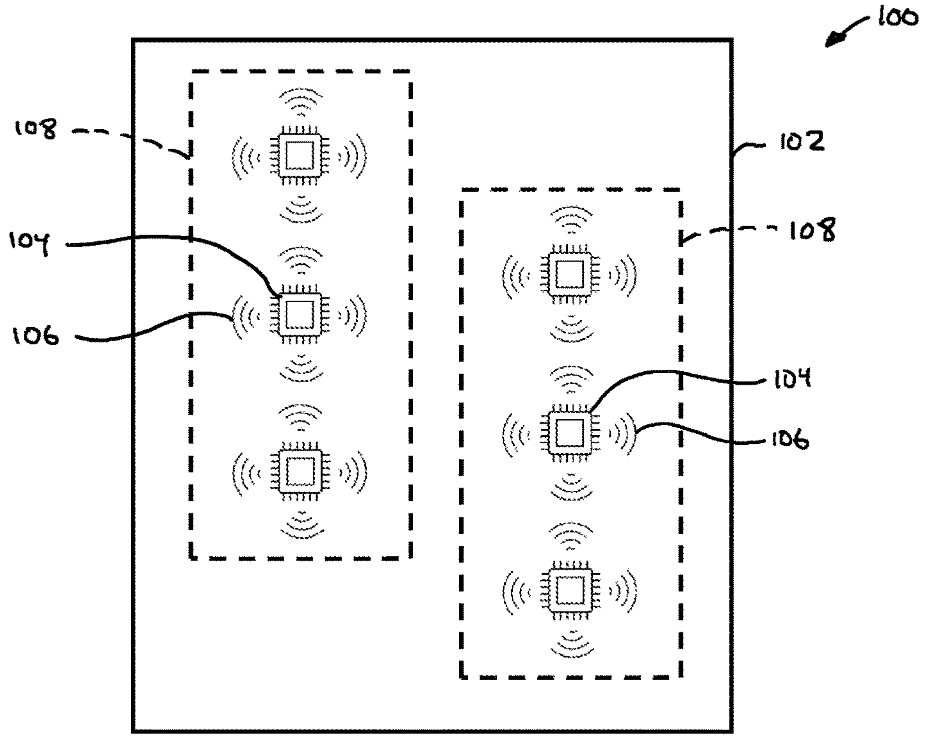
FIG. 1 is a block diagram illustrating one embodiment of a system and method for EMI shielding.

Various technologies pertaining to EMI shielding systems and methods are now described with reference to the drawings, wherein like reference numerals are used to refer to like elements throughout. In the following description, for purposes of explanation, numerous specific details are set forth to provide a thorough understanding of one or more aspects. It may be evident, however, that such aspect(s) may be practiced without these specific details. In other instances, structures and devices are shown in block diagram form to facilitate a non-limiting description of one or more aspects of the disclosure. Further, it is to be understood that functionality that is described as being carried out by certain system components may be performed by multiple components. Similarly, for instance, a component may be configured to perform functionality that is described as being carried out by multiple components. Further, when two components are described as being connected, coupled, joined, affixed, in physical communication, etc., it is to be understood that one or more intervening components or parts can be included in such association.

Moreover, the term "or" is intended to mean an inclusive "or" rather than an exclusive "or." That is, unless specified otherwise, or clear from the context, the phrase "X employs A or B" (or other similar phrases) is intended to mean any of the natural inclusive permutations. That is, the phrase "X employs A or B" is satisfied by any of the following instances: X employs A; X employs B; or X employs both A and B. In addition, the articles "a" and "an" as used in this application and the appended claims should generally be construed to mean "one or more" unless specified otherwise or clear from the context to be directed to a singular form.

The terms "top" and "bottom," or "upper" and "lower," are used herein for identification purposes. Similarly, the terms "first," "second," "third," etc. are used herein for identification purposes. It is contemplated that components disclosed herein can be oriented in substantially any manner consistent with the disclosure. For instance, a top surface need not be above a bottom surface, unless specifically identified in that spatial relationship by the disclosure. Similarly, a "first" component need not come before a "second" or "third" component. Further, as used herein, the term "exemplary" is intended to mean "serving as an illustration or example of something."

Embodiments of the present disclosure provide systems and methods for EMI shielding that include, for example, a shield having one or more flexible or spring like extensions and gaps between the extensions. The flexible or spring like extensions have the ability to compress or bend via spring pressure or force. This allows the extensions to accommodate irregularities in printed circuit boards (e.g., like bending or warping) so contact is maintained with an electrical reference circuit of the printed circuit board thereby providing effective and continuous EMI shielding compared to other shielding arrangements. Additionally (and optionally), the EMI shield can also be used as a heat transfer mechanism allowing heat generated by an electrical circuit to be transferred away from the circuit. The EMI shield can be made from a metal material thereby providing long-term stability versus creeping and/or aging and allows for mass production at low costs. In other embodiments, the EMI shield can be made from a material having a conductive outer coating.

FIG. 1 is a block diagram illustrating one embodiment of a system and method 100 for EMI shielding. The system and method can be used with any arrangement where EMI shielding is required. This includes, for example, radar systems that typically include MMICs operating at microwave frequencies, typically between 1 GHz and 100 GHz, and designed to perform a variety of functions such as amplification, mixing, filtering, and signal generation. In the embodiment of FIG. 1, a printed circuit board (PCB) 102 is provided having one or more electrical circuits 104, which can be MMICs or other circuits that emit electromagnetic radio waves 106 during operation. System 100 also includes one or more EMI shields 108, examples of which will be described hereinafter. In operation, EMI shield 108 is connected to the reference voltage of the EMI emitting circuits of the PCB 102. Radio waves 106 are received by EMI shield 108 connected to the reference voltage, thereby preventing radio waves 106 from being emitted outside of EMI shield 108. FIG. 1 shows by way of example a plurality of EMI shields 108 and electrical circuits 104. In other embodiments, a single EMI shield 108 and a single electrical circuit 104 can be provided on the PCB 102.

Figure 2:
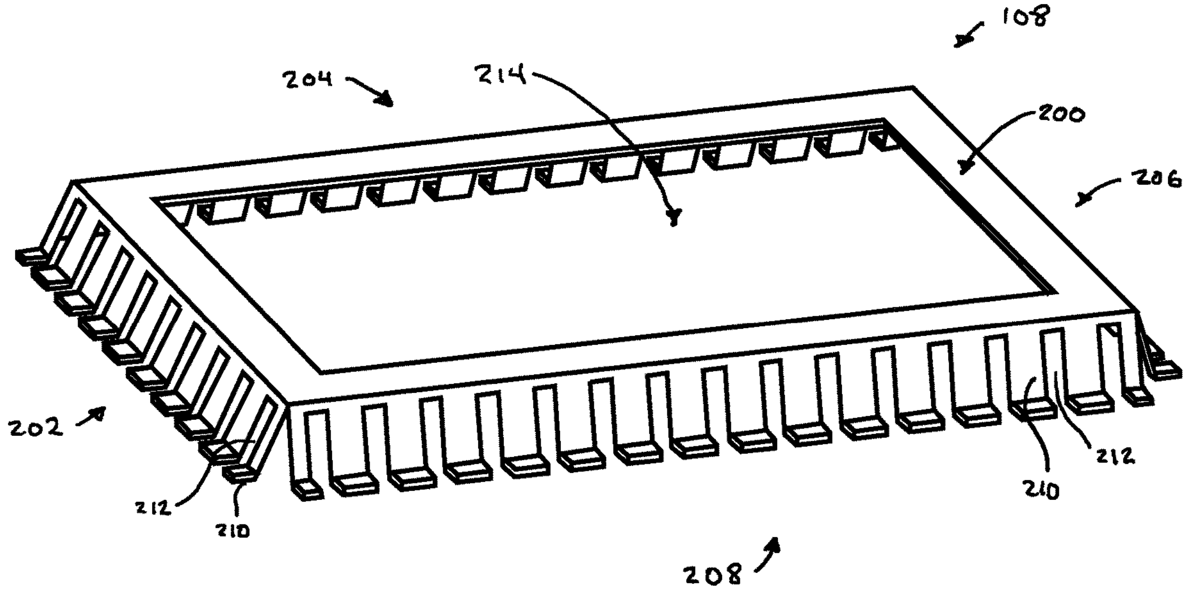
FIG. 2 illustrates one embodiment of an EMI shield.

FIG. 2 illustrates a perspective view of one embodiment of an EMI shield 108. EMI shield 108 includes, for example, a top portion 200 and a plurality of side portions 202, 204, 206, and 208. One or more of the side portions include, for example, one or more extensions (or spring contacts and/or spring elements) 210 and one or more gaps 212. The flexible or spring-like extensions 210 have the ability to compress or bend under a spring pressure or force. This allows extensions 210 to accommodate irregularities in PCB 102 (e.g., like bending or warping) and/or EMI shield 108 itself (e.g., like manufacturing variances, etc.) to maintain contact with the reference voltage of the circuits of the PCB thereby providing effective and continuous EMI shielding of the emitted electromagnetic radiation (e.g., 106). Also in the illustrated embodiment, top portion 200 includes an opening and/or aperture 214 allowing access to the inner shielded space or volume created by EMI shield 108. In other embodiments, top portion 200 need not include such an aperture/opening and may be a continuous surface (e.g., see FIGS. 13, 16, and 20). As will be described and further shown, EMI shield 108 is arranged so that at least side portions 204-208 form a perimeter around the electrical circuit to which the EMI shielding is applied.

Figures 3, 4, 5A, 5B:
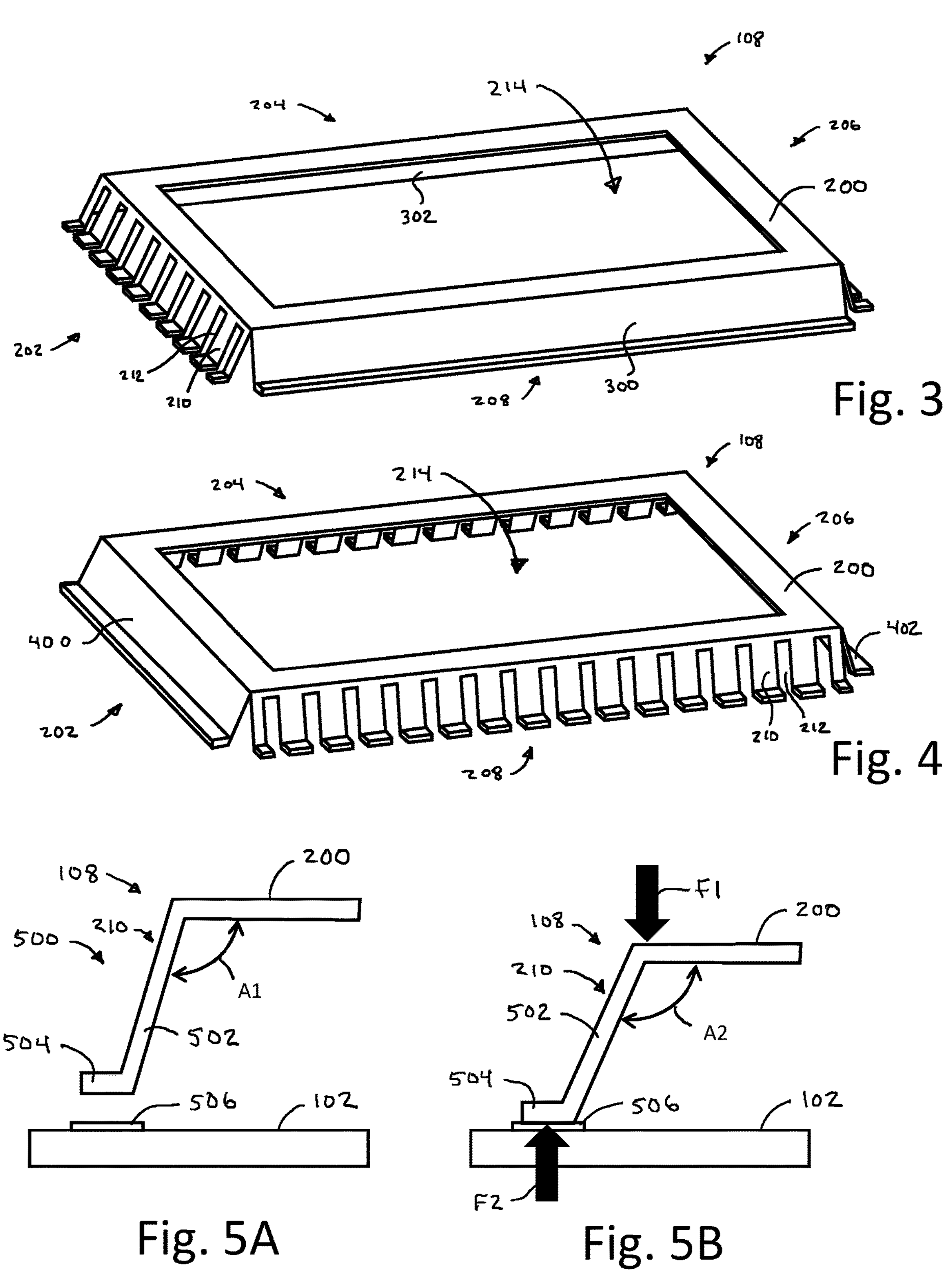
FIG. 3 illustrates another embodiment of an EMI shield.
FIG. 4 illustrates yet another embodiment of an EMI shield.
FIGS. 5A and 5B illustrate one embodiment of an extension or spring element in its uncompressed and compressed state to make contact with an electrical reference circuit or layer.

FIGS. 3 and 4 illustrate perspective views of other embodiments of EMI shield 108. In these embodiments, side portions 204-208 include varying numbers of extensions or spring contacts/elements. For example, in FIG. 3, side portions 204 and 208 have a single extension or spring contact/element 300, 302 while side portions 202 and 206 include a plurality of extensions or spring contacts/elements 210. In the embodiment of FIG. 4, side portions 204 and 208 include a plurality of extensions or spring contacts/elements 210 while side portions 202 and 206 include a single extension or spring contact/element 400, 402. These embodiments are meant to be illustrative and any number of flexible extensions or spring contacts/elements can be provided in each of side portions 202-208. Furthermore, the number of flexible extensions or spring contacts/elements does not have to be equal with respect to opposing side portions (e.g., 202 and 206) or any other side portion.

FIGS. 5A and 5B illustrate cross-sectional views of one embodiment of an extension or spring contact/element 210 in its uncompressed and compressed state making contact with an electrical reference circuit/layer or contact pad 506. Referring now to FIG. 5A, flexible extension or spring contact 210 can include, for example, a body 500 having the plurality of sections or portions 502 and 504. The plurality of sections 502 and 504 can be bent with respect to each other to form, for example, the arrangement shown in FIG. 5A. In other embodiments, more or less sections than that shown can be included. Portion 502 can be, for example, an elongate section extending from top portion 200 and forming a first angle A1 therebetween representing an uncompressed configuration. Portion 504 can be, for example, a contact portion for making contact with reference voltage of the circuits 506 of PCB 102. Contact portion 504 can have the same or different dimensions compared to elongate section 502. Generally, contact portion 504 is sized and dimensioned to provide effective contact with reference circuit/pad 506 in PCB 102.

Referring now to FIG. 5B, extension or spring element 210 is shown in its compressed state making contact with reference circuit/pad 506. In one embodiment, compressive force(s) F1 and F2 are applied to extension or spring element 210. This force can, for example, be applied during PCB 102 assembly and applied via/through an EMI mask/radome (e.g., see FIGS. 8, 14-15, and 16) or other component(s). Because extension or spring element 210 is flexible/compressible, it will bend/flex/compress under the applied forces. In this state, the angle A2 top portion 200 and extension or spring element 210 will be different from the uncompressed angle A1. In some embodiments, compressed angle A2 will be greater than uncompressed angle A1 due to the flexing or bending of extension or spring element 210. As previously mentioned, this flexing/bending/compression allows extension or spring element 210 to maintain contact with the reference voltage of the circuits 506 even though the PCB 102 may be bent or warped instead of flat or planar (or may have started planar and become bent or warped over time). In this manner, the EMI shield 108 continues to provide effective EMI shielding by not losing contact with the reference voltage of the circuits 506 of the PCB 102 even though irregularities may exist in PCB 102 and/or EMI shield itself.

Figures 6, 7:
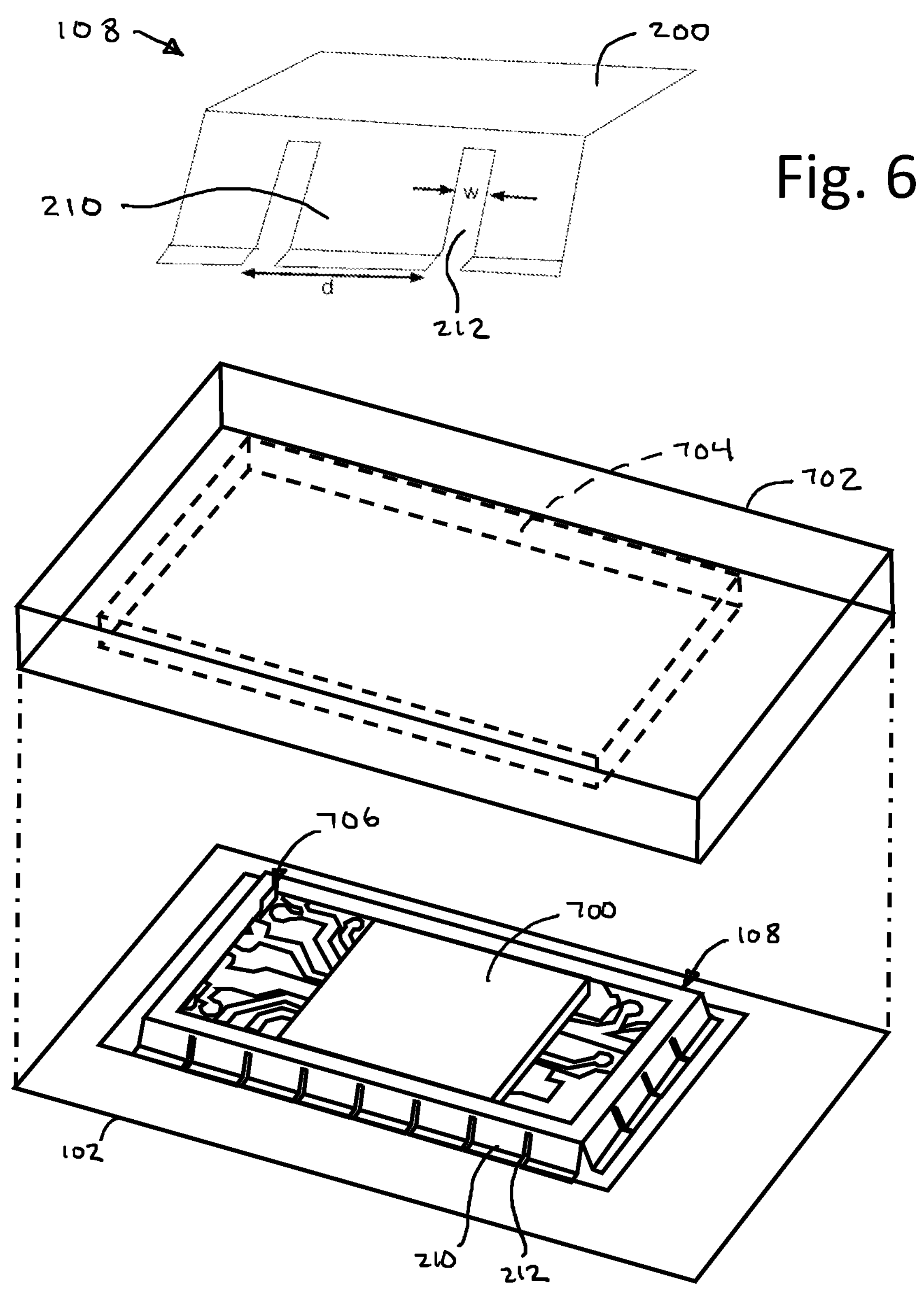
FIG. 6 illustrates one embodiment of an extension or spring contact/element having gaps with a width "w" and extensions with a pitch distance "d."
FIG. 7 illustrates a perspective view of another embodiment of a system and method for EMI shielding.

FIG. 6 illustrates one embodiment of an extension or spring contact/element 210 having a pitch distance "d" and gaps 212 having a width "w." In one embodiment, gap 212 has an approximate width according to the following:

$$w < \lambda/30$$

wherein w comprises the approximate gap width and λ comprises the wavelength of the electromagnetic radiation to be shielded. Other formulas can also be used. For example, gap 212 width w can be less than λ/x where x can be a number value larger or smaller than 30. In general, the gap width w should be less than the electromagnetic wavelength λ to be shielded.

Extension or spring element 210 has an approximate pitch according to the following:

$$d \neq n\left(\frac{\lambda}{4}\right)$$

wherein d comprises an approximate pitch length, n comprises an integer greater than zero (0), and λ comprises the wavelength of electromagnetic radiation to be shielded. By having a pitch based on the quarter-wave size (λ/4), the extensions or spring contacts/elements 210 can effectively receive the electromagnetic radiation for EMI shielding. Depending on the amount of shielding desired, the above formulas can be varied from that shown (e.g., λ/4) and still achieve EMI shielding.

FIG. 7 illustrates an exploded perspective view of another embodiment of a system and method for EMI shielding. PCB 102 is provided with EMI shield 108 surrounding an electric circuit such as, for example, an MMIC. A thermal interface material (TIM) layer 700 can be included on the MMIC to facilitate heat transfer away from the electric circuit. In one embodiment, PCB 102 includes an optional alignment feature 706, such as one or more guide pins, clips, or similar devices to properly align EMI shield 108 on the PCB 102 so that EMI shield 108 contacts the reference voltage of the circuits of the PCB 102. A mask 702 is shown removed above the PCB 102. Mask 702 includes a cavity or space 704 for EMI shield 108 (and electric circuit). Mask 702 can be a variety of materials including, for example, a layer of conductive material applied over the surface of an PCB, EMI Shield, and/or MMIC, or other electronic components. Mask 702 can cover the active area of the component, while optionally leaving other components exposed such as, for example, contacts, bond pads, antennas, etc. Mask 102 can be made from a material that is metal such as, for example, aluminum, copper and/or other conductive material. In operation, mask 702 generally assists in reducing EMI and its exact arrangement can vary based on the specific requirements and design of the component being shielded. As will be shown and described, mask 702 is applied to PCB 102 in a manner that protects and shields components on PCB 102.

Figure 8:
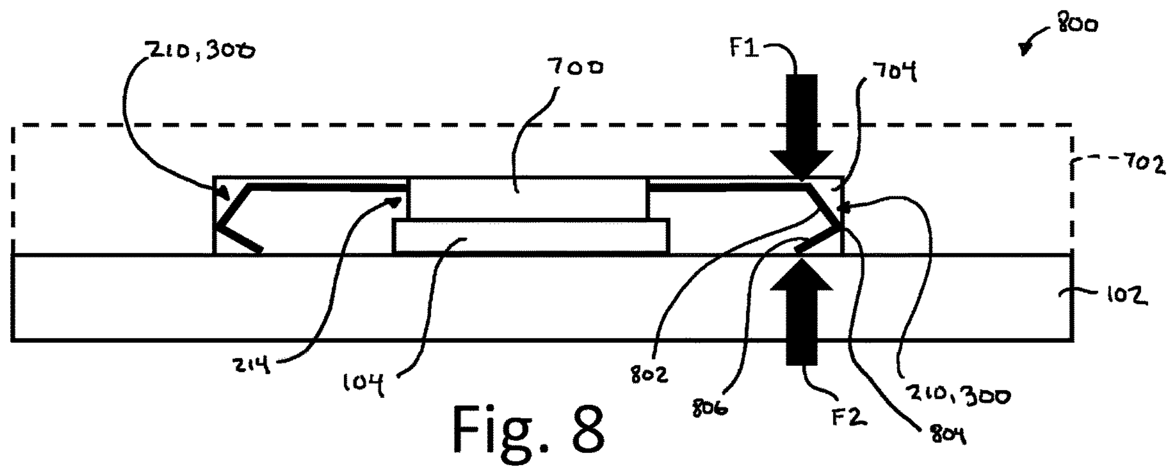
FIGS. 8-13 illustrate cross-sectional views of various embodiments of the systems and methods for EMI shielding.

FIGS. 8-13 illustrate cross-sectional views of embodiments of the systems and methods for EMI shielding having various arrangements of extension or spring elements 210, 300. FIG. 8 illustrates an embodiment 800 where extension or spring element 210, 300 has various bent sections 802 and 806 forming a downward facing hook-like shape. A bend or junction 804 is between sections 802 and 804. When compressive forces F1 and/or F2 are applied to EMI shield 108, one or more of sections 802 and 806 bend or deflect at junction 804 in a spring-like manner to contact the reference circuit/pads of PCB 102.

Figure 9:
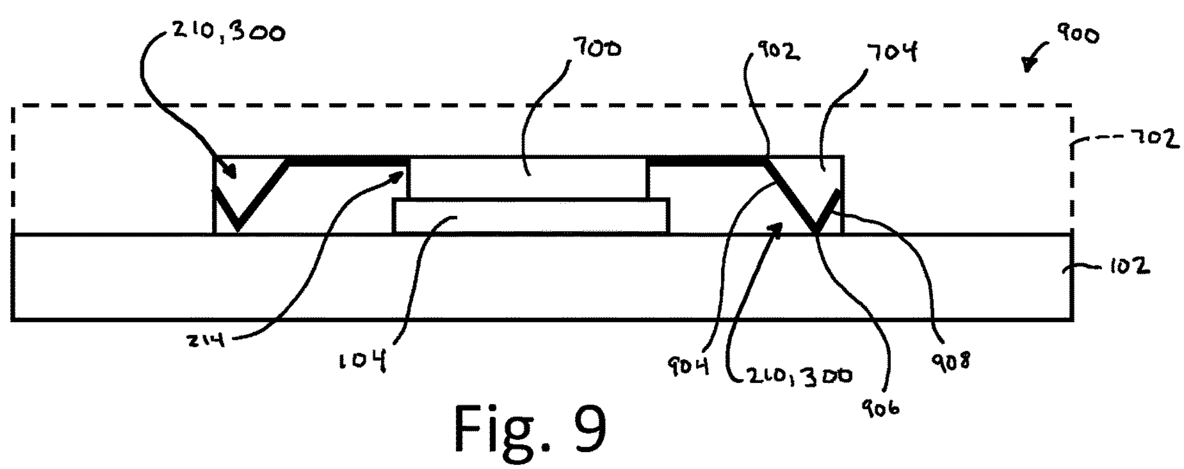

FIG. 9 illustrates an embodiment 900 where extension or spring element 210, 300 has various bent sections 904 and 908 forming an upward facing hook-like shape. A bend or junction 906 is between sections 904 and 908. When compressive forces (similar to F1 and/or F2 of FIG. 8) are applied to EMI shield 108, section 904 bends or deflects at junction 902 in a spring-like manner to contact the reference voltage of the circuits of PCB 102. In other embodiments, sections 904 and 908 may also bend or deflect at junction 906 in a spring-like manner.

Figure 10:
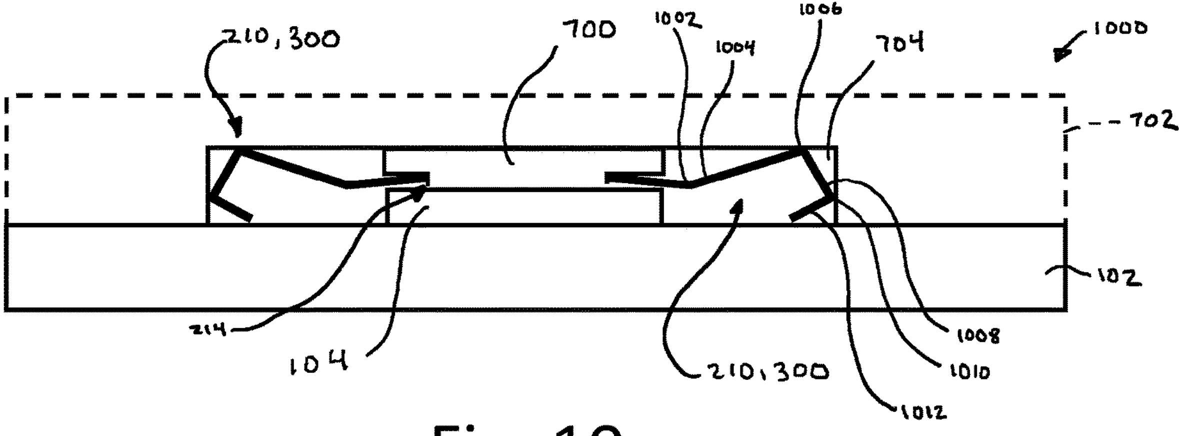

FIG. 10 illustrates an embodiment 1000 where extension or spring element 210, 300 has various bent sections 1004, 1008 and 1012 forming a downward facing hook-like shape. A plurality of bends or junctions 1002, 1006 and 1010 are provided between the bent sections. When compressive forces (similar to F1 and/or F2 of FIG. 8) are applied to EMI shield 108, section 1004 bends or deflects at junction 1002 in a spring-like manner to contact the reference voltage of the circuits of PCB 102. In other embodiments, sections 1008 and 1012 may also bend or deflect at junctions 1006 and/or 1010 in a spring-like manner.

Figure 11:
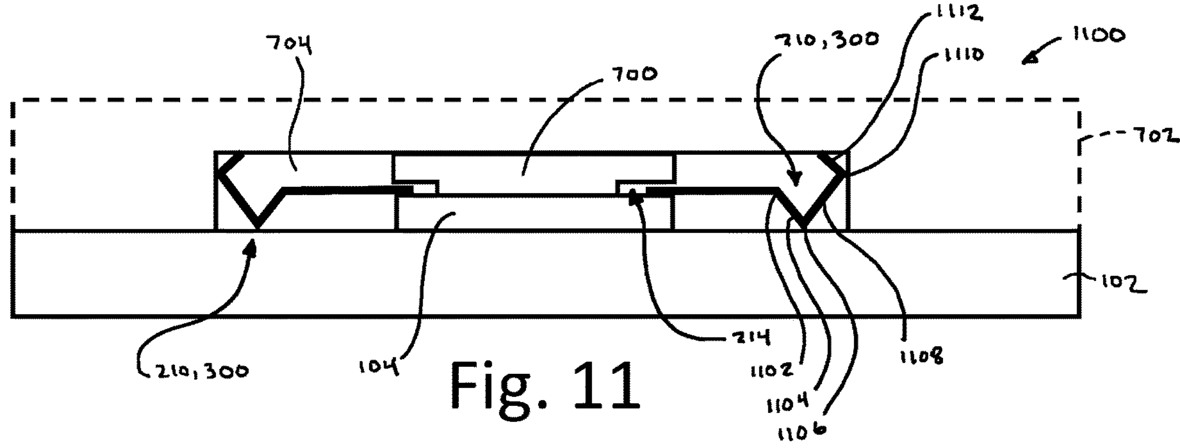

FIG. 11 illustrates an embodiment 1100 where extension or spring element 210, 300 has various bent sections 1104, 1108 and 1112 forming an upward facing hook-like shape. A plurality of bends or junctions 1102, 1106 and 1110 are provided between the bent sections. When compressive forces (similar to F1 and/or F2 of FIG. 8) are applied to EMI shield 108, one or more of sections 1104, 1108 and/or 1112 bend or deflect at junctions 1102, 1106 and/or 1110 in a spring-like manner to contact the reference voltage of the circuits of PCB 102.

Figure 12:
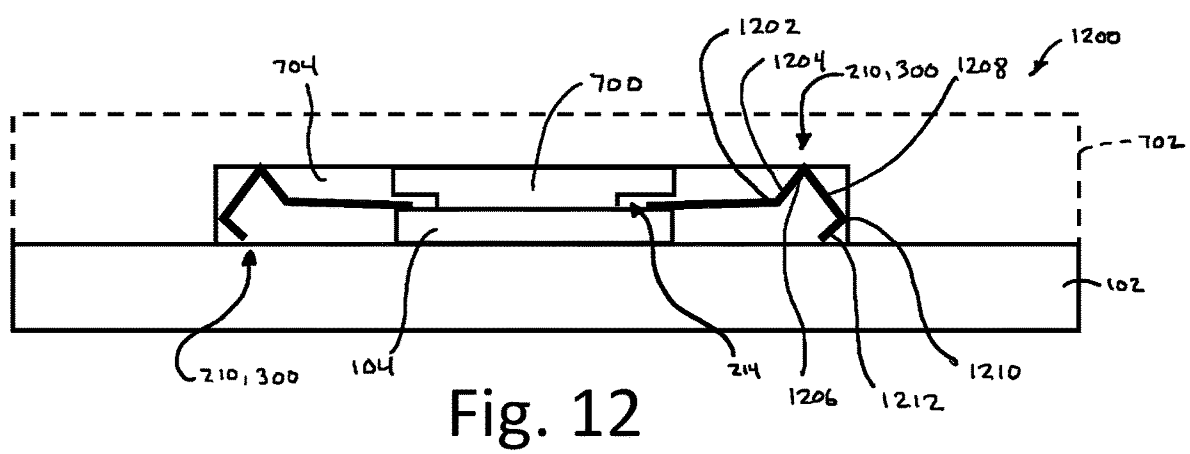

FIG. 12 illustrates an embodiment 1200 where extension or spring element 210, 300 has various bent sections 1204, 1208 and 1212 forming a downward facing hook-like shape. A plurality of bends or junctions 1202, 1206 and 1210 are provided between the bent sections. When compressive forces (similar to F1 and/or F2 of FIG. 8) are applied to EMI shield 108, one or more of sections 1204, 1208 and/or 1212 bend or deflect at junctions 1202, 1206 and/or 1210 in a spring-like manner to contact the reference voltage of the circuits of PCB 102.

Figure 13:
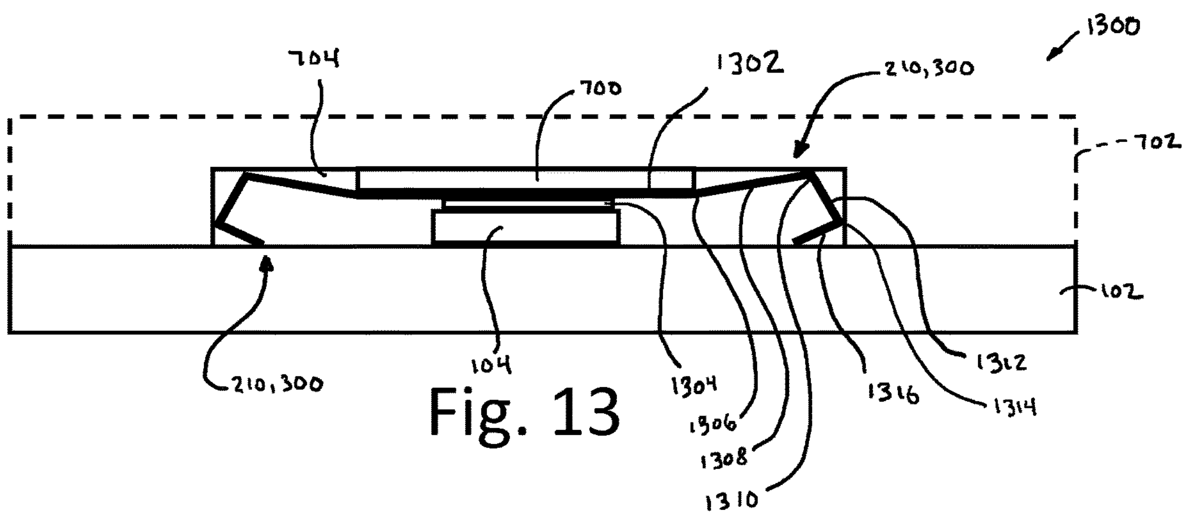

FIG. 13 illustrates an embodiment 1300 of an EMI shield 108 having a planar top portion 1302 and where extension or spring elements 210, 300 have various bent sections 1308, 1312 and 1316 forming a downward facing hook-like shape. A plurality of bends or junctions 1306, 1310 and 1314 are provided between the bent sections. When compressive forces (similar to F1 and/or F2 of FIG. 8) are applied to EMI shield 108, one or more of sections 1308, 1312 and/or 1316 bend or deflect at junctions 1306, 1310, and/or 1314 in a spring-like manner to contact the reference voltage of the circuits of PCB 102. The embodiment of FIG. 13 also optionally includes a thermal interface grease layer 1304 between the electrical circuit 104 and the top portion 1302 of EMI shield 108. Planar top portion 1302 is between thermal interface grease layer 1304 and TIM layer 700 thus providing a thermal path to cool the electric circuit 104. Further, thermal interface grease 1304 can be compressed to accommodate the compressive forces applied to EMI shield 108. Use of thermal interface grease improves thermal contact and compensates for surface roughness of the components. In this embodiment, a larger TIM layer 700 can be used that extends between the bending parts (e.g., extensions 201, 300) of EMI shield 108 compared to other embodiments.

Figure 14:
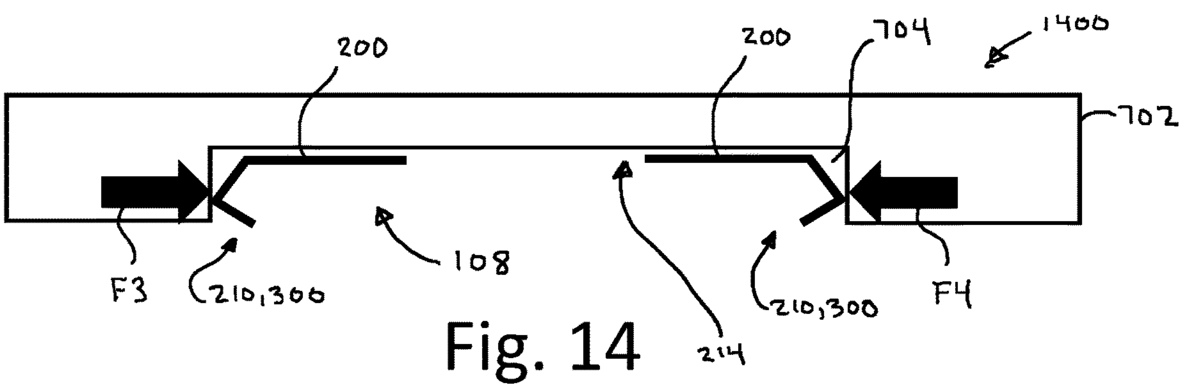
FIGS. 14 and 15 illustrate cross-sectional views of various embodiments of EMI shields preassembled and prior to association with a printed circuit board.
Figure 15:
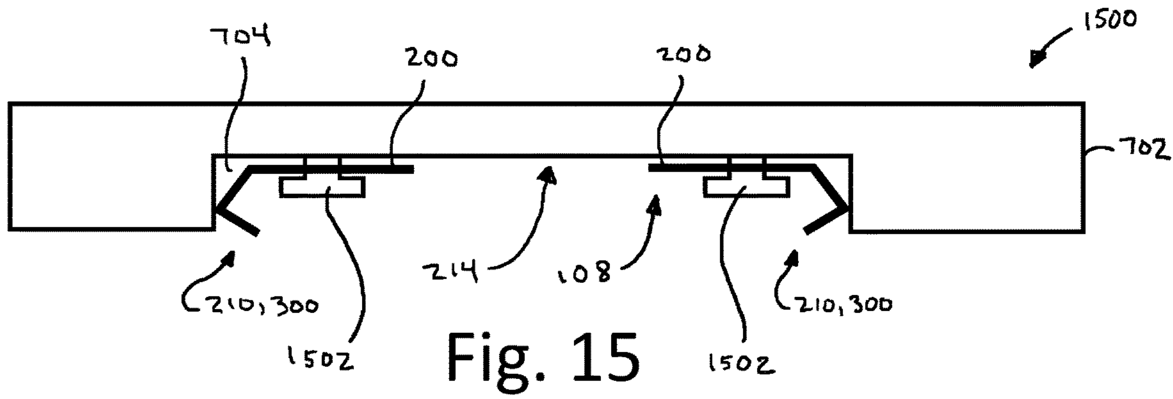

FIGS. 14 and 15 illustrate cross-sectional views of various embodiments of EMI shields 108 preassembled with molded or milled EMI masks 702 and prior to association with PCB 102. In FIG. 14, an embodiment 1400 is shown having EMI shield 108 within cavity 704 and retained therein via radially compressive forces F3 and F4 created by the side walls of cavity 704. In FIG. 15, an alternate embodiment 1500 is shown having EMI shield 108 within cavity 704 and kept therein via retainers 1502. Retainers 1502 can be, for example, fasteners such as aluminum or copper rivets or other rivet-like structures having a body and wider head portion, as shown. In either embodiment, extensions 210, 300 can extend beyond the body of mask 702 and then compress or flex as they contact the voltage reference of the circuits of PCB 102 during assembly therewith.

Figure 16:
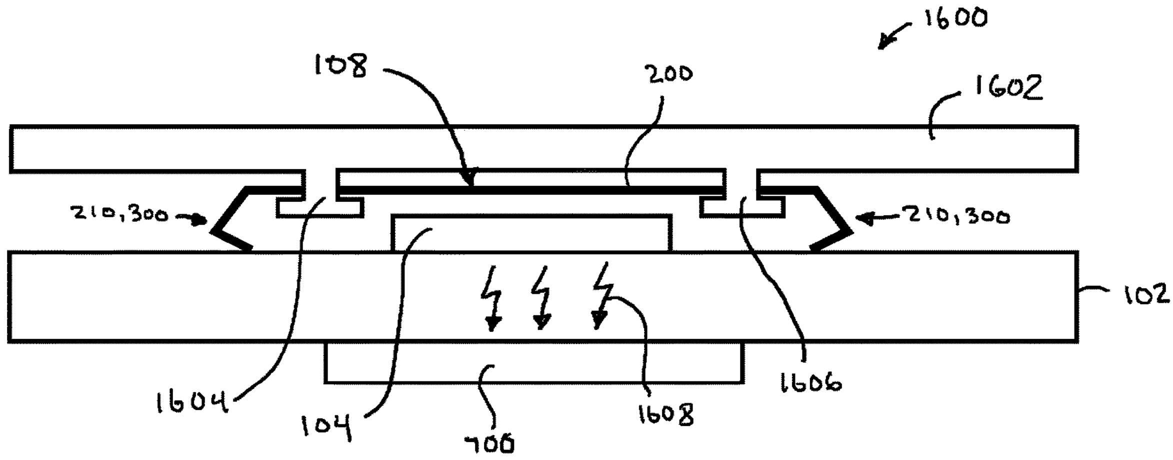
FIG. 16 illustrates a cross-sectional view of one embodiment of an EMI shield incorporated into a protective cover (e.g., radome).

FIG. 16 illustrates a cross-sectional view of one embodiment 1600 of an EMI shield 108 incorporated into a protective cover (e.g., radome) 1602. Protective cover 1602 can be made of a non-conductive material such as plastic or fiberglass that provides physical and/or chemical protection to PCB 102 and its contents. In the embodiment shown, protective cover 1602 includes, for example, retainers 1604 and 1606 similar to 1502 of FIG. 15. Further, a TIM layer 700 can be provided on the side of PCB 102 opposite the electric circuit 106 to facilitate heat transfer 1608 away from the electric circuit 104.

Figure 17:
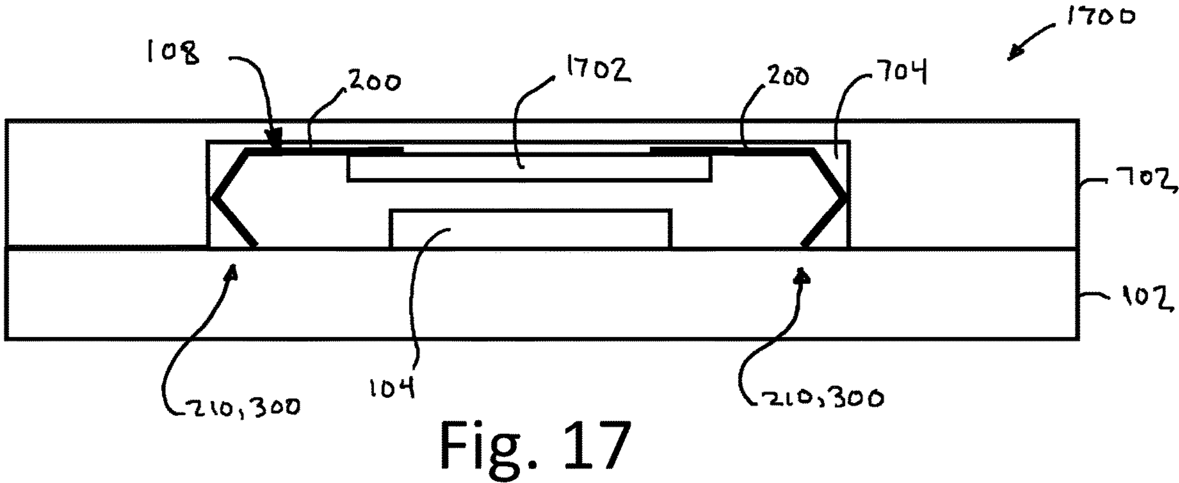
FIGS. 17 and 18 illustrate cross-sectional views of various embodiments of systems and methods for EMI shielding that optionally include EMI absorber components.
Figure 18:
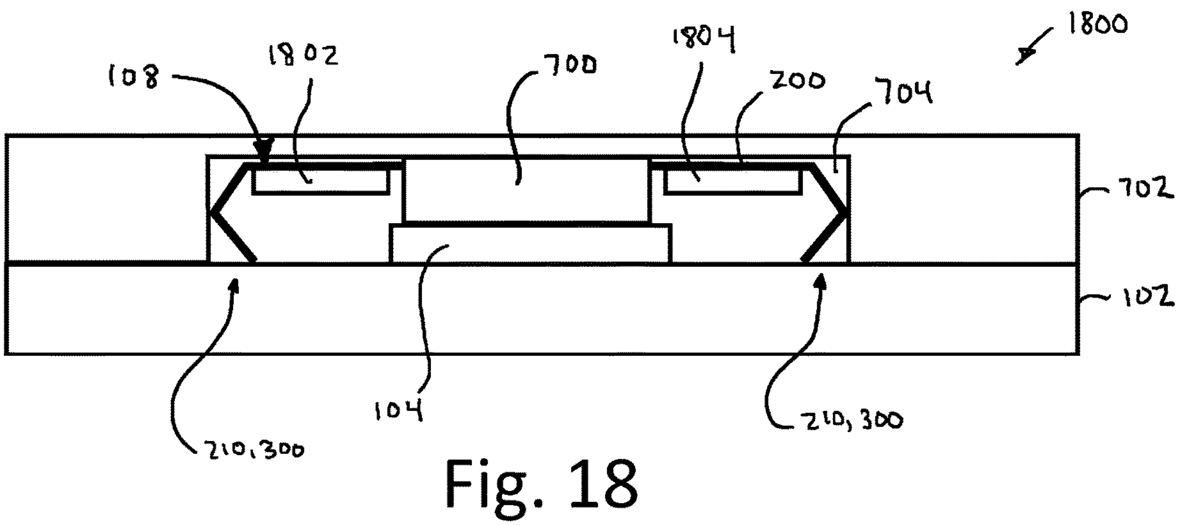

FIGS. 17 and 18 illustrate cross-sectional views of various embodiments of systems and methods for EMI shielding that optionally include EMI absorber components avoiding cavity resonances. In the embodiment of FIG. 17, system 1700 includes EMI absorber 1702 within the shielded volume or space of EMI shield 108. EMI absorber 1702 can be made from materials such as, for example, ferrites, carbon-loaded polymers, or metal foams that are capable of absorbing electromagnetic energy. In the embodiment of FIG. 18, system 1800 includes both EMI absorbers 1802 and 1804 and TIM layer 700 within the shielded volume of EMI shield 108. The EMI absorbers can be layers or components affixed to the EMI shield in any suitable manner including, for example, adhesives, tapes, and/or glues. Moreover, the EMI absorbers can be arranged to completely or partially fill the unoccupied spaces/volume within EMI shield 108.

Figure 19:
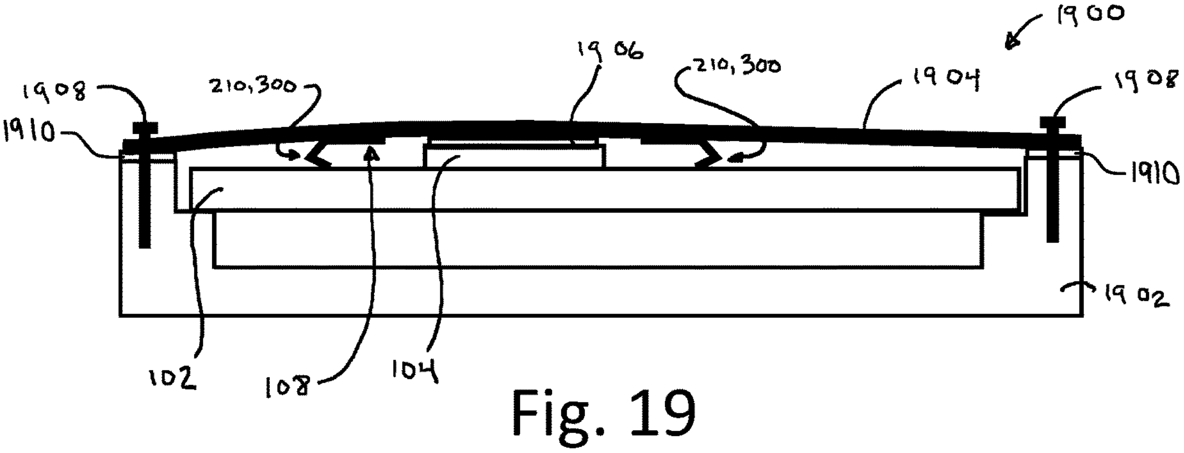
FIGS. 19 and 20 illustrate cross-sectional views of various embodiments of systems and methods for EMI shielding that have a flexible mask component.
Figure 20:
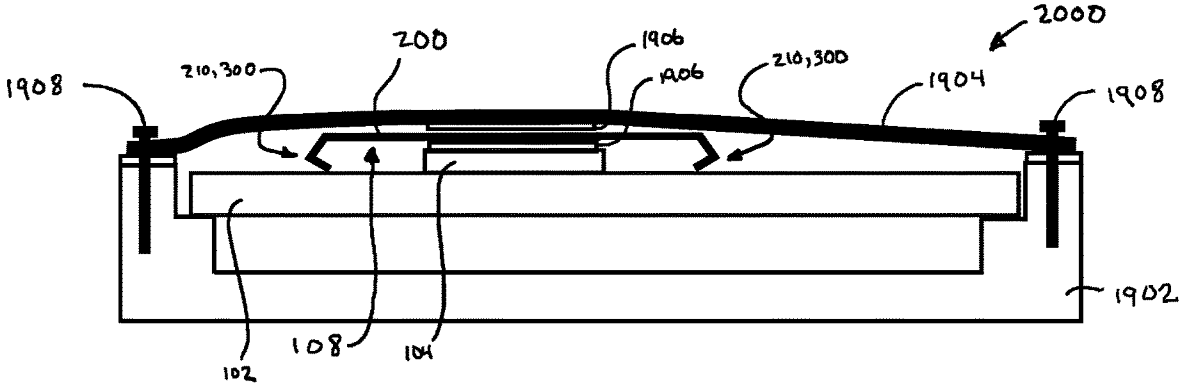

FIGS. 19 and 20 illustrate cross-sectional views of various embodiments of systems and methods for EMI shielding that have a flexible EMI mask component. In FIG. 19, embodiment 1900 includes a PCB carrier plate 1902 that can be made of a conductive and/or insulator material. PCB 102 having EMI shield 108 sits within a cavity of the carrier plate 1902. A flexible EMI mask 1904 made of a conductive material such as, for example, metal (e.g., aluminum, copper, etc.) is provided. Flexible mask 1904 has the ability to bend and to provide a compressive force on to the EMI shield 108 to ensure its contact with the reference voltage of the circuits of PCB 102.

A thermal interface grease 1906 can be optionally provided to improve the contact between electric circuit 104 and flexible mask 1904 to better thermal transfer from electric circuit 104 to flexible mask 1904. Flexible mask 1904 can be secured to carrier plate 1902 by any number of means including, for example, fasteners (screws, clips, clamps, etc.) Additionally, thermal interface grease 1910 can be provided between flexible mask 1904 and carrier plate 1902 to improve the thermal transfer between the components. In the embodiment of FIG. 19, EMI shield 108 includes an opening or aperture in its top portion (e.g., see opening 214 in the embodiments of FIGS. 2-4 and 7). This permits a nearly direct connection between flexible mask 1902 and electric circuit 104 via optional thermal interface grease 1906.

Embodiment 2000 of FIG. 20 is similar to that of FIG. 19 except that the connection between flexible mask 1902 and electric circuit 104 is indirect via top portion 200 of EMI shield 108 that does not have an opening or aperture therein. In this embodiment, thermal interface grease 1906 may be provided on one or both sides of top portion 200 to improve the thermal transfer of heat between electric circuit 104 and flexible mask 1902.

The use of a flexible mask 1902 provides the advantage of tolerance compensation due to various sizes (e.g., height) of electric circuits 104 and associated soldering heights connecting the circuits to the PCB. Optionally, flexible mask 1902 can be provided with geometrically weakened bending areas to control the amount of compressive force being applied to the EMI shield 108 and other components. The geometrically weakened areas can, for example, be located near where flexible mask 1902 contacts EMI shield 108.

Figure 21:
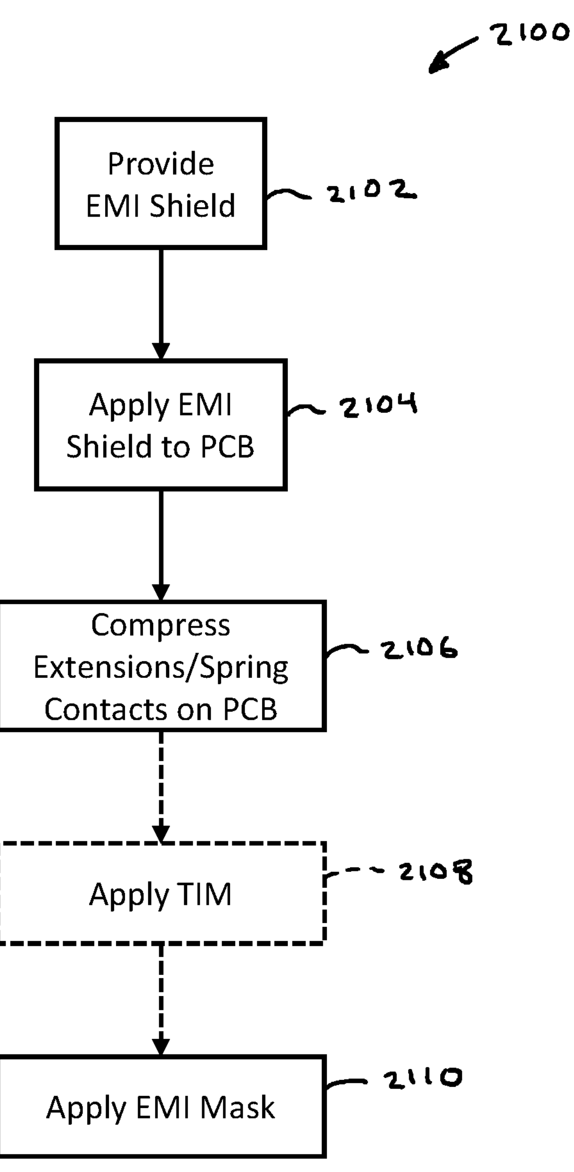
FIG. 21 illustrates another embodiment of a system and method for EMI shielding.

Referring now to FIG. 21, another embodiment of a system and method is shown for EMI shielding a volume. Method 2100 can begin, for example, in step 2102 where an EMI shield is provided. The EMI shield can be, for example, any one of the previously described EMI shields. In step 2104, the EMI shield is applied to a PCB and, preferably over at least one electric circuit or component to be shielded. As previously described, one example of such an electric circuit includes MMICs and other circuits/components that emit electromagnetic radio waves or are sensitive to electromagnetic waves. In step 2106, the extensions/spring contacts of the EMI shield compress to make connection with a reference layer of the PCB. In one embodiment, a compressive force is applied to the EMI shield through, for example, application of another component such as an EMI mask, radome cover, etc. In step 2108, a TIM layer(s) (and/or thermal interface grease layers) can be optionally applied to the electric circuit directly and/or indirectly via a top portion of the EMI shield or surface of the PCB. In step 2110, an EMI mask is applied over the EMI shield to make direct or indirect contact with the EMI shield via, for example, a TIM or thermal interface grease layer(s). So applied, an electric circuit is provided with a compressive EMI shield that compensates via a spring-like (or flexing or bending or material section torsion) action for PCB irregularities (e.g., warping, bending, etc.) and other irregularities (e.g., integrated circuit height tolerances, soldering heights, etc.) While FIG. 21 illustrates one embodiment, the exact order of the process steps need not necessarily be performed in the order shown or described herein and may be modified to exclude certain steps as has been described throughout the disclosure.

Hence, the systems and methods disclosed provide electronic EMI shields that can compensate for irregularities associated with PCBs and the circuits thereon. The EMI shield includes one or more extensions/spring elements that can compress, flex, bend, or tordate under an applied force to provide a spring-like action for connecting the EMI shield to a reference layer/circuit of a PCB. The extensions/spring elements can be, for example, separated by gaps having dimensions that prevent entry/exit of EMI radiation. So arranged, the EMI shield can be economically constructed of, for example, a thin metal material such as aluminum, copper, electrically conductive plastic, plastic components/parts with electrical conductive coating(s), etc. And, the EMI shield can be reliably applied over a range of PCB and electric circuit physical tolerances while still providing effective EMI shielding of the desired components.

Systems and methods have been described herein in accordance with at least the examples set forth below.

(A1) In one aspect, an electrical system is described herein. The electrical system includes a printed circuit board comprising an electrical circuit having electromagnetic radio frequency emissions. The electrical system further includes a shield having a top portion and a plurality of side portions connected to the top portion and surrounding the electrical circuit. The plurality of side portions comprises one or more spring contacts and one or more gaps, wherein the gaps are disposed between the spring contacts. The one or more spring contacts comprise a compressed state when contacting a reference circuit of the printed circuit board.

(A2) In some embodiments of the electrical system of (A1), the gap comprises an approximate width according to the following:

$$w < \lambda/30$$

wherein w comprises the approximate gap width and λ comprises a wavelength of electromagnetic radiation to be shielded.

(A3) In some embodiments of at least one of the electrical systems of (A1)-(A2), the at least one extension comprises an approximate pitch according to the following:

$$d \neq n\left(\frac{\lambda}{4}\right)$$

wherein d comprises an approximate pitch, n comprises an integer greater than zero (0), and λ comprises a wavelength of electromagnetic radiation to be shielded.

(A4) In some embodiments of at least one of the electrical systems of (A1)-(A3), the top portion comprises an opening for allowing at least a portion of a thermal interface material to extend therethrough and contact the electrical circuit.

(A5) In some embodiments of at least one of the electrical systems of (A1)-(A3), the top portion comprises a planar surface portion for contacting at least a portion of a thermal interface material.

(A6) In some embodiments of at least one of the electrical systems of (A1)-(A5), the electrical system further comprising a mask layer having a conductive material and a cavity comprising the shield and electrical circuit.

(A7) In some embodiments of at least one of the electrical systems of (A1)-(A5), the electrical system further comprising a mask layer having a conductive material and a cavity comprising the shield and electrical circuit; and a thermal interface material between the mask layer and electrical circuit and extending through an opening in the top portion of the shield.

(A8) In some embodiments of at least one of the electrical systems of (A1)-(A7), at least one of the spring contacts comprises an elongated member that deflects when the shield is compressed to contact the reference circuit.

(A9) In some embodiments of at least one of the electrical systems of (A1)-(A8), the shield comprises a metal material.

(A10) In some embodiments of at least one of the electrical systems of (A1)-(A9), the shield comprises a body having a conductive coating.

(B1) In another aspect, a radar system is described herein. The radar system includes a printed circuit board comprising a radar circuit having electro-magnetic radio frequency emissions. The radar system further includes a metal shield having a top portion and a perimeter connected to the top portion and at least partially surrounding the circuit. The perimeter comprises one or more spring elements and one or more gaps, wherein the gaps are disposed between the spring elements. The one or more spring elements comprise a bent position when contacting a reference circuit of the printed circuit board.

(B2) In some embodiments of the radar system of (B1), the one or more spring elements comprise at least one continuous spring element.

(B3) In some embodiments of at least one of the radar systems of (B1)-(B2), the one or more spring elements comprises a plurality of spring elements divided by the one or more gaps.

(B4) In some embodiments of at least one of the radar systems of (B1)-(B3), the radar system further includes a mask layer having a conductive material and a cavity comprising the metal shield and electrical circuit; and a thermal interface material between the mask layer and electrical circuit and extending through an opening in the top portion of the shield.

(B5) In some embodiments of at least one of the radar systems of (B1)-(B4), the top portion comprises a rectangular shape and includes a rectangular opening therein.

(B6) In some embodiments of at least one of the radar systems of (B1)-(B5), the gap comprises an approximate width according to the following:

$$w < \lambda/30$$

wherein w comprises the approximate gap width and λ comprises a wavelength of electromagnetic radiation to be shielded.

(B7) In some embodiments of at least one of the radar systems of (B1)-(B6), the at least one extension comprises an approximate pitch according to the following:

$$d \neq n\left(\frac{\lambda}{4}\right)$$

wherein d comprises an approximate pitch, n comprises an integer greater than zero (0), and λ comprises a wavelength of electromagnetic radiation to be shielded.

(C1) In another aspect, a method of forming a shielded electrical circuit is described herein. The method includes providing a printed circuit board having a circuit that generates electro-magnetic radio frequency emissions. Moreover, the method includes placing a metal shield on the circuit board, wherein this step comprises the steps of compressing one or more spring elements of the metal shield thereby placing the one or more spring elements in contact with an electrical reference circuit, and wherein compressing one or more spring elements comprises bending the one or more spring elements. The method further includes securing the metal shield on the circuit board by placing the metal shield within a cavity of a conductive mask layer of the printed circuit board.

(C2) In some embodiments of the method of (C1), the compressing the one or more spring elements comprises compressing each of the one or more spring elements until it contacts the electrical reference circuit.

(C3) In some embodiments of at least one of the methods of (C1)-(C2), the method further includes the step of placing a thermal interface material between the radar circuit and the mask layer.

What has been described above includes examples of one or more embodiments. It is, of course, not possible to describe every conceivable modification and alteration of the above devices or methodologies for purposes of describing the aforementioned aspects, but many further modifications and permutations of various aspects are possible and meant to be included within the disclosure herein. For example, the flexible extensions or spring elements/contacts can have a variety of geometries. This includes for example not only the linear bent sections disclosed, but also sections that gradually and continuously curve to form the same or similar shape/geometry. Accordingly, the described aspects are intended to embrace all such alterations, modifications, and variations that fall within the scope of the appended claims. Furthermore, to the extent that the term "includes" is used in either the details description or the claims, such term is intended to be inclusive in a manner similar to the term "comprising" as "comprising" is interpreted when employed as a transitional word in a claim.

What is claimed is:

1. An electrical system, comprising:

a printed circuit board comprising an electrical circuit having electro-magnetic radio frequency emissions;

a shield having a top portion and a plurality of side portions connected to the top portion and surrounding the electrical circuit; and a mask layer having a conductive material and a cavity comprising the shield and the electrical circuit;

wherein the plurality of side portions comprise spring contacts and gaps, wherein:

each of the spring contacts is integrally formed with a respective side portion of the plurality of side portions, one or more of the gaps is integrally formed in a respective side portion of the plurality of side portions and is disposed between consecutive spring contacts comprised among the spring contacts, each of the spring contacts comprise a compressed state when contacting a reference circuit of the printed circuit board, and at least one of the spring contacts comprises a first section and a second section, wherein, when the shield is compressed, one or more of the first section and the second section deflect at a junction between the first section and the second section such that:

the first section contacts at least the reference circuit, and the second section contacts an inner side surface of the mask layer; or the first section contacts at least the inner side surface of the mask layer, and the second section contacts at least the reference circuit, wherein the inner side surface of the mask layer corresponds to a boundary of the cavity.

2. The electrical system of claim 1, wherein the one or more of the gaps comprises an approximate gap width according to the following:

$$w < A/30$$

wherein w comprises the approximate gap width and A comprises a wavelength of electromagnetic radiation to be shielded.

3. The electrical system of claim 1, wherein one or more of the spring contacts comprises an approximate pitch according to the following:

$$d = \#n\left(\frac{A}{4}\right)$$

wherein d comprises an approximate pitch, n comprises an integer greater than zero (0), and A comprises a wavelength of electromagnetic radiation to be shielded.

4. The electrical system of claim 1, wherein the top portion comprises an opening for allowing at least a portion of a thermal interface material to extend therethrough and contact the electrical circuit.

5. The electrical system of claim 1, wherein the top portion comprises a planar surface portion for contacting at least a portion of a thermal interface material.

6. The electrical system of claim 1, further comprising a mask layer having a conductive material and a cavity comprising the shield and the electrical circuit.

7. The electrical system of claim 1, further comprising:

a thermal interface material between the mask layer and electrical circuit and extending through an opening in the top portion of the shield.

8. The electrical system of claim 1, wherein the shield comprises a metal material.

9. The electrical system of claim 1, wherein the shield comprises a body having a conductive coating.

10. A radar system, comprising:

a printed circuit board comprising a radar circuit having electro-magnetic radio frequency emissions;

a metal shield having a top portion and a perimeter connected to the top portion and at least partially surrounding the radar circuit; and a mask layer having a conductive material and a cavity comprising the metal shield and electrical circuit;

wherein the perimeter comprises spring elements and gaps, wherein:

each of the spring elements is integrally formed with a respective portion of the perimeter;

one or more of the gaps is integrally formed in a respective portion of the perimeter and is disposed between consecutive spring elements comprised among the spring elements; and each of the spring elements comprise a bent position when contacting a reference circuit of the printed circuit board; and at least one of the spring elements comprises a first section and a second section, wherein, when the metal shield is compressed, one or more of the first section and the second section deflect at a junction between the first section and the second section such that:

the first section contacts at least the reference circuit, and the second section contacts an inner side surface of the mask layer; or the first section contacts at least the inner side surface of the mask layer, and the second section contacts at least the reference circuit, wherein the inner side surface of the mask layer corresponds to a boundary of the cavity.

11. The radar system of claim 10, wherein the spring elements comprise at least one continuous spring element.

12. The radar system of claim 10, wherein the consecutive spring elements are divided by the one or more of the gaps.

13. The radar system of claim 10, further comprising:

a thermal interface material between the mask layer and electrical circuit and extending through an opening in the top portion of the metal shield.

14. The radar system of claim 10, wherein the top portion comprises a rectangular shape and includes a rectangular opening therein.

15. The radar system of claim 10, wherein the one or more of the gaps comprises an approximate gap width according to the following:

$$w < A/30$$

wherein w comprises the approximate gap width and A comprises a wavelength of electromagnetic radiation to be shielded.

16. The radar system of claim 10, wherein one or more of the spring elements comprises an approximate pitch according to the following:

$$d = \#n\left(\frac{A}{4}\right)$$

wherein d comprises an approximate pitch, n comprises an integer greater than zero (0), and A comprises a wavelength of electromagnetic radiation to be shielded.

17. A method of forming a shielded electrical circuit comprising steps of:

providing a printed circuit board having a circuit that generates electromagnetic radio frequency emissions;

placing a metal shield on the printed circuit board, the metal shield having a top portion and a plurality of side portions connected to the top portion and surrounding the circuit, wherein:

the plurality of side portions comprise spring elements and gaps;

each of the spring elements is integrally formed with a respective side portion of the plurality of side portions; and one or more of the gaps is integrally formed in a respective portion of the plurality of side portions and is disposed between consecutive spring elements comprised among the spring elements;

wherein placing the metal shield on the printed circuit board comprises steps of compressing the spring elements of the metal shield thereby placing one or more of the spring elements in contact with an electrical reference circuit of the printed circuit board, and wherein compressing the spring elements comprises bending the spring elements; and securing the metal shield on the printed circuit board by placing the metal shield within a cavity of a conductive mask layer of the printed circuit board, wherein the compressing the spring elements comprises compressing each of the spring elements until:

a first section of the spring element contacts at least the electrical reference circuit, and a second section of the spring element contacts an inner side surface of the conductive mask layer; or the first section contacts at least the inner side surface of the conductive mask layer, and the second section contacts at least the electrical reference circuit, wherein the inner side surface of the conductive mask layer corresponds to a boundary of the cavity.

18. The method of claim 17, further comprising a step of placing a thermal interface material between the circuit and the mask layer.

* * * * *